United States Patent
Mo (10) Patent No.: US 10,802,068 B2
(45) Date of Patent: Oct. 13, 2020

(54) METHOD OF DETECTING ABNORMAL TEST SIGNAL CHANNEL OF AUTOMATIC TEST EQUIPMENT

(71) Applicant: Powertech Technology Inc., Hukou Township, Hsinchu County (TW)

(72) Inventor: Chu Yuan Mo, Hukou Township (TW)

(73) Assignee: Powertech Technology Inc., Hukou Township (TW)

(*) Notice: Subject to any disclaimer, the term of this patent is extended or adjusted under 35 U.S.C. 154(b) by 66 days.

(21) Appl. No.: 16/213,464

(22) Filed: Dec. 7, 2018

(65) Prior Publication Data

US 2020/0182927 A1 Jun. 11, 2020

(51) Int. Cl.
*G01R 31/28* (2006.01)
*G01R 3/00* (2006.01)

(52) U.S. Cl.
CPC .......... *G01R 31/2834* (2013.01); *G01R 3/00* (2013.01)

(58) Field of Classification Search
CPC . A61B 5/055; G01R 33/3614; G01R 33/3852
See application file for complete search history.

(56) References Cited

U.S. PATENT DOCUMENTS

| | | | |
|---|---|---|---|
| 2008/0021677 A1* | 1/2008 | Buxton | G05B 19/41875 702/184 |
| 2009/0299679 A1* | 12/2009 | Desineni | G01R 31/2894 702/119 |
| 2011/0275170 A1* | 11/2011 | Van Wagenen | G01R 31/31907 438/14 |
| 2016/0334461 A1* | 11/2016 | Wu | G01R 31/2834 |

* cited by examiner

*Primary Examiner* — Akm Zakaria
(74) *Attorney, Agent, or Firm* — PATENTTM.US (57) ABSTRACT

A method of detecting abnormal test signal channel of automatic test equipment firstly obtains a raw test data and then divides into the data groups according to a mapping data. The test data of DUTs in one data group are generated by the same group of probes. A yield of each data group is further estimated. A yield of a wafer is further estimated when the yield of the data group matches a first failure threshold. An abnormal test signal channel is determined when the yield of the wafer does not match a second failure threshold or the yield of the wafer matches the normal threshold. Therefore, to add the detecting method in an original test procedure of the ATE, the operator easily identifies which blocks in the failure color on the test data map are caused by the abnormal test signal channel.

13 Claims, 9 Drawing Sheets

METHOD OF DETECTING ABNORMAL TEST SIGNAL CHANNEL OF AUTOMATIC TEST EQUIPMENT

BACKGROUND OF THE INVENTION

1. Field of the Invention

The present invention is related to a test method for automatic test equipment, and more particularly to a method of detecting abnormal test signal channel of automatic test equipment.

2. Description of the Prior Arts

Figure 7:
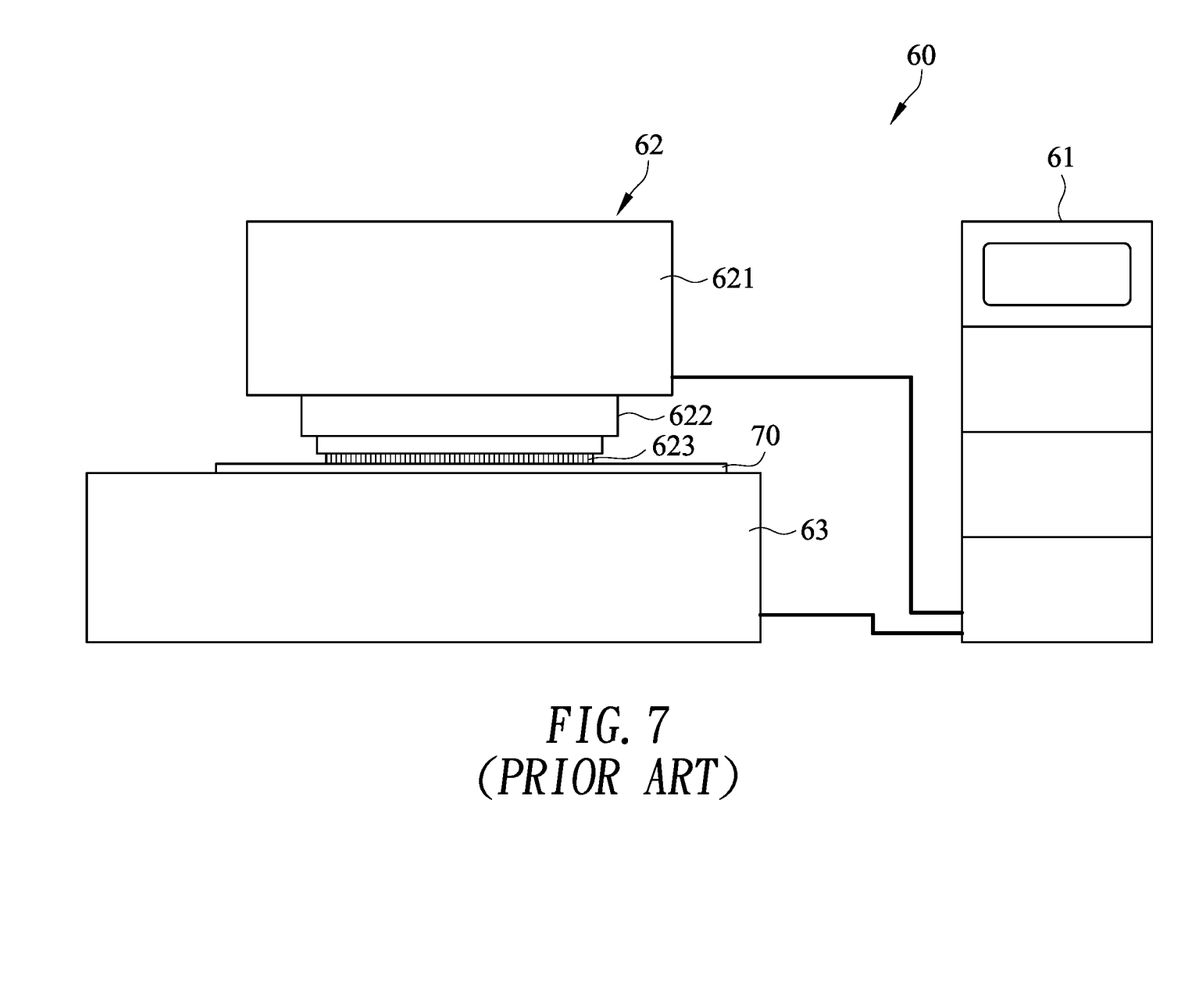
FIG. 7 is a schematic view of a conventional ATE in accordance with the prior art.

With reference to FIG. 7, an automatic test equipment (hereinafter ATE) 60 is shown and has a host 61, a probe card device 62 and a test platform 63. The host 61 communicates with the probe card device 62 and the test platform 63. The probe card device 62 has a controller 621 and a probe card 622 with a plurality of probes 623. The controller 621 controls the probe card 621 to execute a test procedure. A plurality of devices under test (hereinafter DUTs), such as chips of a wafer 70, are arranged on a top of the test platform 63. The controller 621 arranges a plurality of test signal channels (not shown), so one test signal channel corresponds one of the probes 623. The controller 621 further controls the probes 623 of the probe card 622 moves downwardly until the probes 623 respectively touches the corresponding DUTs. The controller 621 further outputs a testing signal to each DUT through the corresponding test signal channel and the probe 623 thereof. After then, the controller 621 receives a response signal from the tested DUT through the corresponding test signal channel and the probe 623 thereof.

In general, a number of the probes 623 are less than a number of the DUTs, so the controller 621 has to execute the test procedures several times to test all of the DUTs. The host 61 obtains a raw test data corresponding to the response signals of all DUTs from the controller 621. The host 61 further converts the raw test data to a test data map consisted of different color blocks. A number of the color blocks are equal to a number of the DUTs, and an arrangement of the color blocks matches that of DUTs. Therefore, an operator of the ATE can easily identify whether any fail DUT corresponding to the block in a fail color has been tested.

To reduce test time, a new probe card with more probes is employed and the controller re-arranges the test signal channels, so the probes of the new probe card are divided to a plurality of groups, and one group includes more than one probes. The probes in one group share one of the test signal channels. Therefore, the times of executing the test procedure for all of the DUTs are decreased. The host also obtains the raw test data corresponding to the response signals of all DUTs from the controller and then converts the raw test data to the test data map consisted of different color blocks.

When the test data map shows that all blocks in any one of the groups are marked in a failure color, the operator determines that all DUTs corresponding to the blocks in the failure color of the group has failed. However, when the test signal channel is damaged but the corresponding tested DUTs are normal, all blocks in one group corresponding to the damage test signal channel are also marked in the failure color on the test data map. Therefore, the operator cannot identify whether the DUTs are actually failed or not according to the test data map.

To overcome the shortcomings of the test method for ATE, the present invention provides a method of detecting abnormal status of shared channels of the ATE to mitigate or obviate the aforementioned problems.

SUMMARY OF THE INVENTION

An objective of the present invention is to provide a method of detecting abnormal test signal channel of automatic test equipment (hereinafter ATE).

To achieve the objective as mentioned above, the method of detecting abnormal test signal channel of the ATE, having q test signal channels and a probe card with m probes, wherein m>q and the method comprises steps of:

(a) obtaining a mapping data, wherein the m probes are divided into n groups, each group has k probes and the mapping data records that each of the n groups corresponds to one of the q test signal channels, wherein q>n or q=n;

(b) obtaining a first raw test data for x DUTs of a wafer, wherein the first raw test data having a test data for each DUT and the first raw test data is divided into y data groups, wherein y=x/(j*k) and j is an amount of a test time of the probe card and j>0;

(c) determining whether a yield of each of the data groups matches to a first failure threshold, wherein a first failure group is determined when the yield thereof matches to the first failure threshold;

(d) determining whether a yield of the wafer matches a second failure threshold when at least one first failure group is determined in the step (c); and (e) generating a failure group information when the determining result of the step (d) is negative, wherein the failure group information records the test signal channel corresponding to the first failure group is abnormal.

Based on the foregoing description, in the method of the present invention the raw test data is firstly divided into the data groups according to the mapping data. The test data in one data group are generated by the same group of probes. The yield of each data group is further estimated. The yield of the wafer is further estimated when the yield of the data group matches the first failure threshold. The abnormal test signal channel is determined when the yield of the wafer does not match the second failure threshold, or the yield of the wafer matches the normal threshold. Therefore, to add the method of the present invention in the original test procedure of the ATE, the operator easily identifies which blocks in the failure color on the test data map are caused by the abnormal test signal channel.

Other objectives, advantages and novel features of the invention will become more apparent from the following detailed description when taken in conjunction with the accompanying drawings.

DETAILED DESCRIPTION OF THE PREFERRED EMBODIMENTS

The present invention provides a method of detecting abnormal test signal channel of automatic test equipment (ATE). With embodiments and drawings thereof, the features of the present invention are described in detail as follow.

Figure 1:
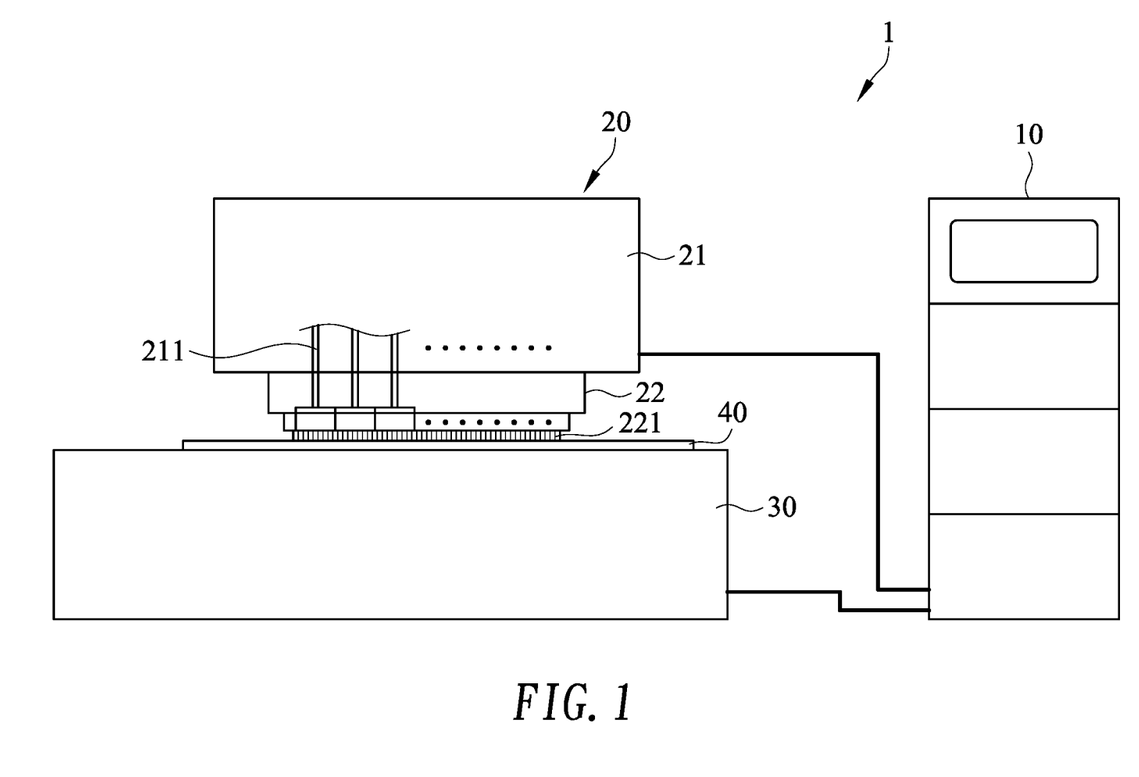
FIG. 1 is a schematic view of an ATE in accordance with the present invention.
Figure 2:
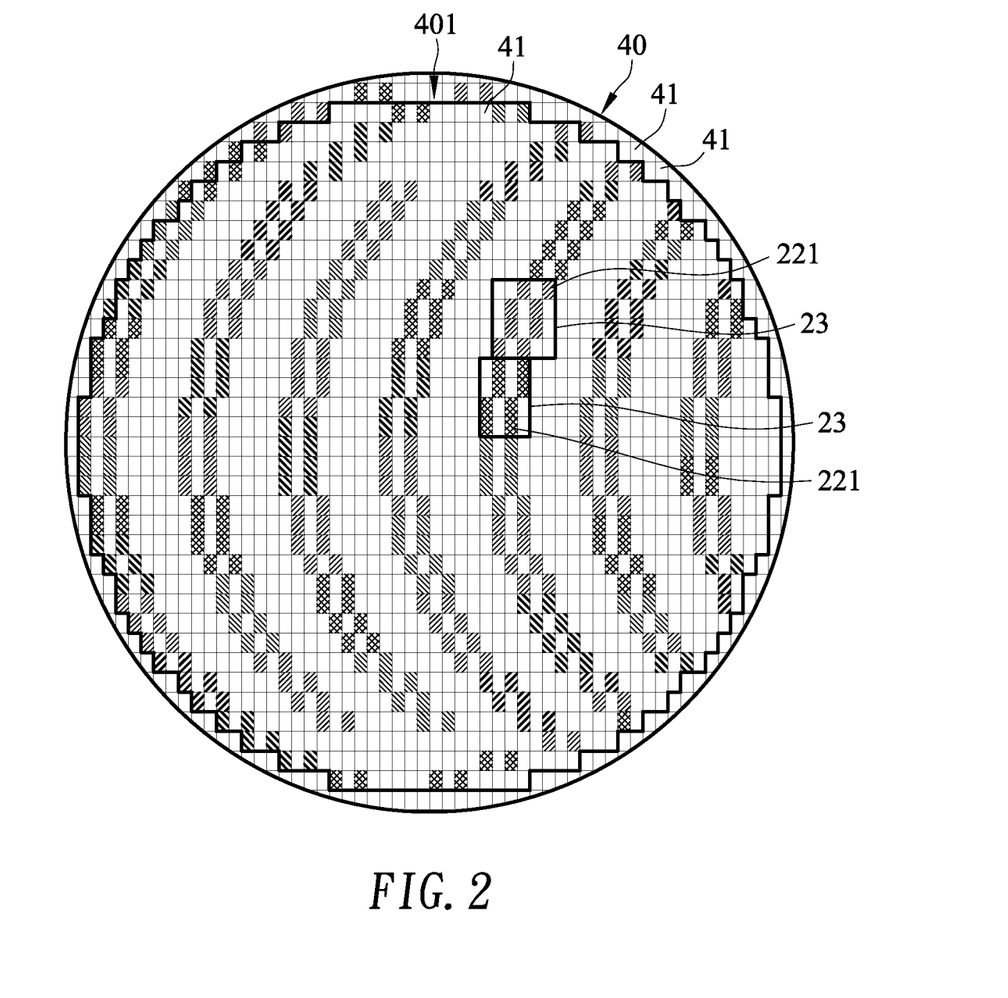
FIG. 2 is a top view of a wafer consisted of a plurality of DUTs, wherein different marks marked on a part of DUTs respectively present different groups of probes.

With reference to FIG. 1, the ATE 1 comprises of a host 10, a probe card device 20, and a test platform 30. The probe card device 20 has a controller 21 and a probe card 22 with m probes 221. The controller 21 controls the probe card 22 to execute a test procedure. Before the test procedure is executed, the m probes 221 of the probe card 22 are divided into n groups of the probes 23, as shown in FIG. 2. One group of probes 23 has k probes 221, wherein (k*n)>m or (k*n)=m. Each of the n groups of the probes 23 corresponds to one of q test signal channels 211, wherein q>n or q=n. With further reference to FIG. 2, when x devices under test (hereinafter DUTs 41), such as chips of a wafer 40, are mounted on the test platform 30, the controller 21 controls the probes 221 to contact and test corresponding DUTs 41 to obtain a test data for each of the DUT 41. Therefore, the host 10 obtains a raw test data including the test data of all DUTs 41 from controller 21. The raw test data may be referred to as the MP file or CP data. The host 10 further converts the raw test data to a test data map 50 shown in FIG. 5A.

Figure 3A:
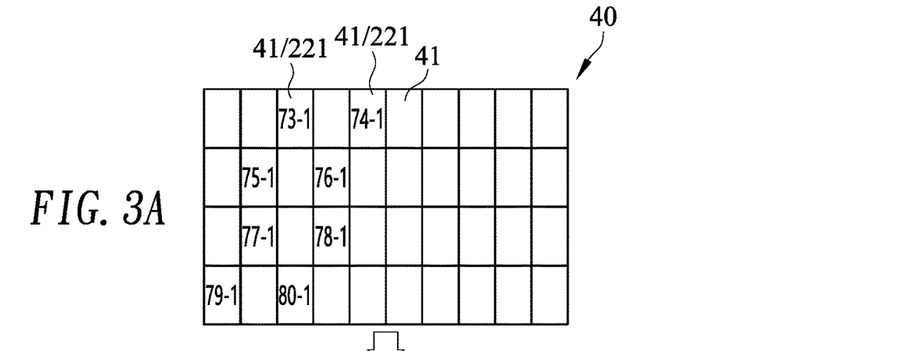
FIGS. 3A to 3D are enlarged schematic views of a part of DUTs with one set of marks shown in FIG. 2, which show a time sequence of a testing procedure of automatic test equipment (hereinafter ATE)
Figure 3B:
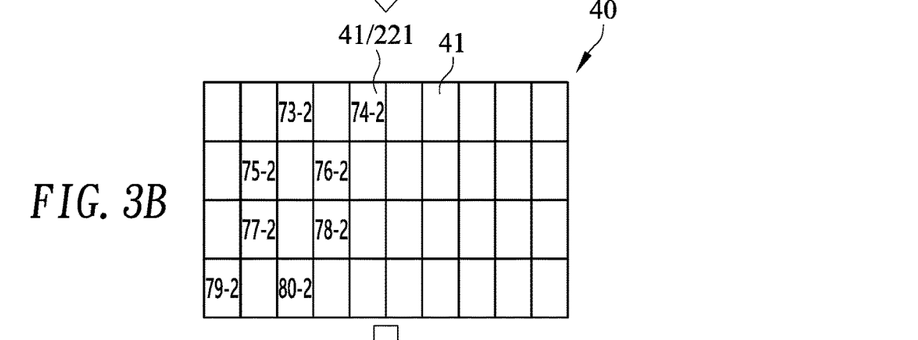
Figure 3C:
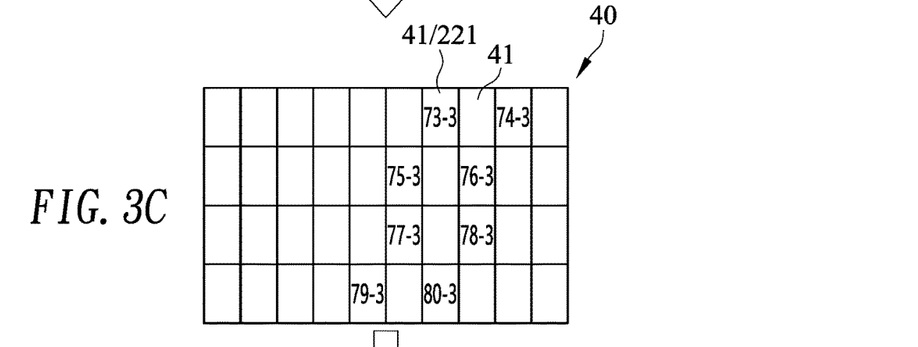
Figure 3D:
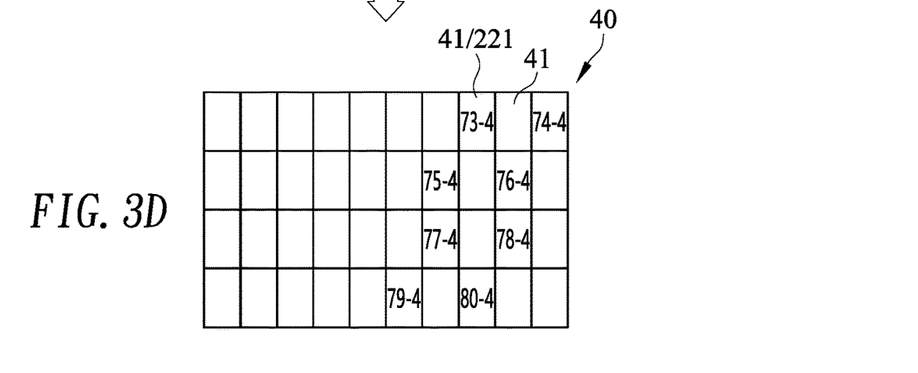
Figure 4A:
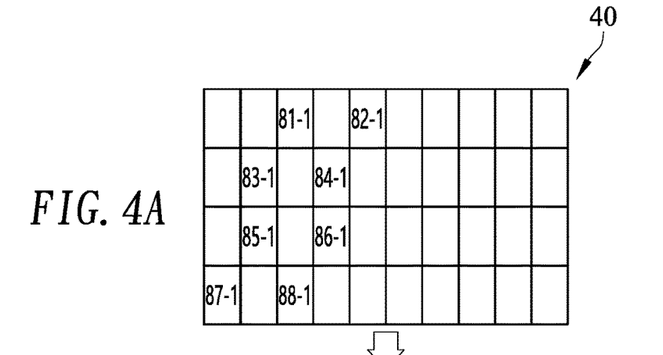
FIGS. 4A to 4D are enlarged schematic views of a part of DUTs with another set of marks shown in FIG. 2, which show a time sequence of a testing procedure of the ATE.
Figure 4B:
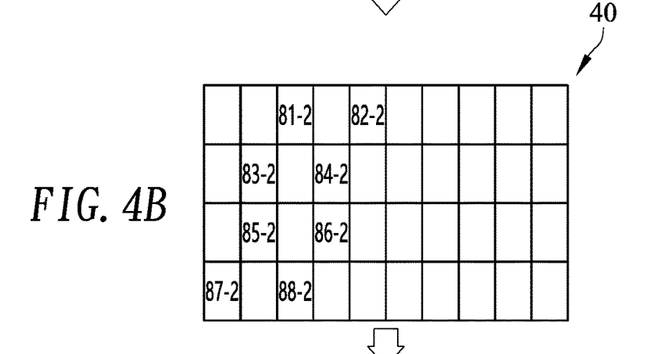
Figure 4C:
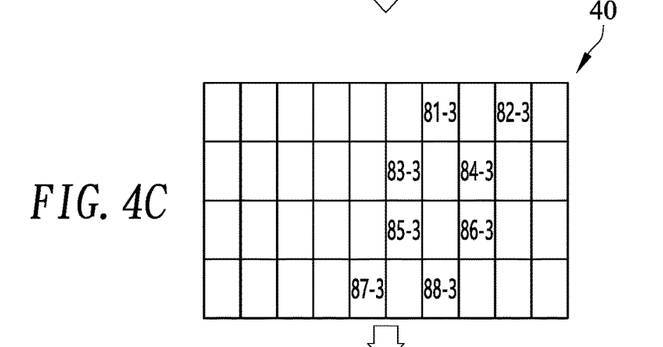
Figure 4D:
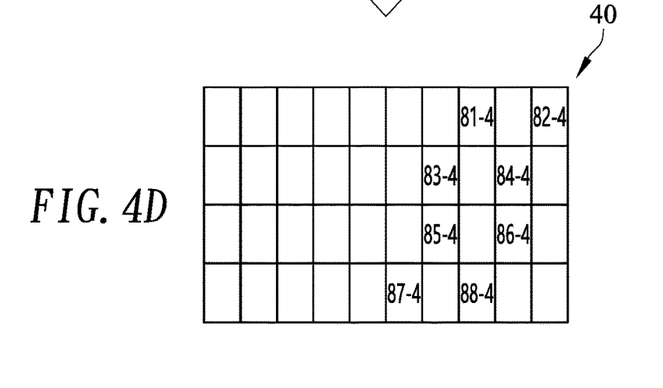
Figure 5A:
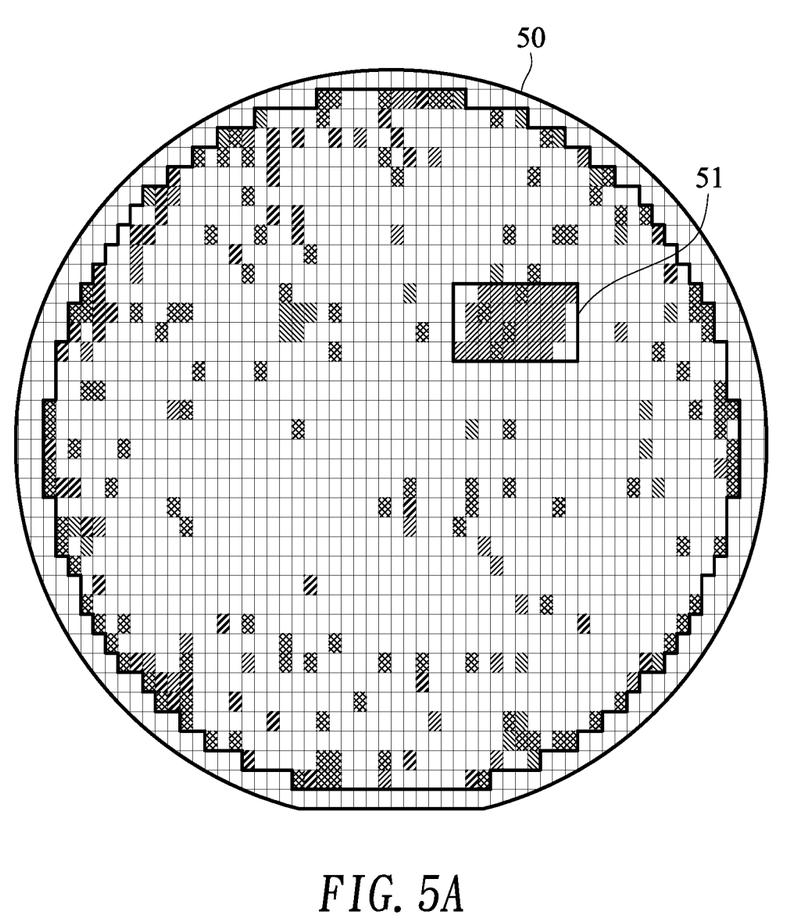
FIG. 5A is a test data map by testing the wafer in FIG. 2.

In one embodiment, with reference to FIGS. 1 and 2, the probe card 22 of the ATE 1 may have 411 number of probes 221 (m=411), 64 number of the test signal channels 211 (q=64). One group of probes 23 may have 8 number of the probes 221 (k=8). The wafer 40 may have 1520 number of chips (x=1520). The probes 221 may be divided into 51 groups of the probes 23 (n=m/k=51). Each group of probes 23 corresponds to one test signal channel 211. When the ATE 1 is used to test 1520 number of DUTs 41, each group of probes 23 may come in contact with the wafer 40 for at least four times (j=4) to test all DUTs 41, wherein j is the number of times the probe card 22 is tested. In the first test, as shown in FIGS. 3A and 4A, two groups of the probes (73-1~80-1), (81-1~88-1) touch 16 number of DUTs 41. In the second test, as shown in FIGS. 3B and 4B, the two groups of the probes (73-2~80-2), (81-2~88-2) are moved to touch another 16 number of DUTs 41. In the third test, as shown in FIGS. 3C and 4C, the two groups of the probes (73-3~80-3), (81-3~88-3) are moved to touch another 16 number of DUTs 41. In the fourth test, as shown in FIGS. 3D and 4D, the two groups of the probes (73-4~80-4), (81-4~88-4) are moved to touch another 16 number of DUTs 41. With reference to FIG. 5A, the host 10 obtains the raw test data 50 from the controller 21.

Figure 5B:
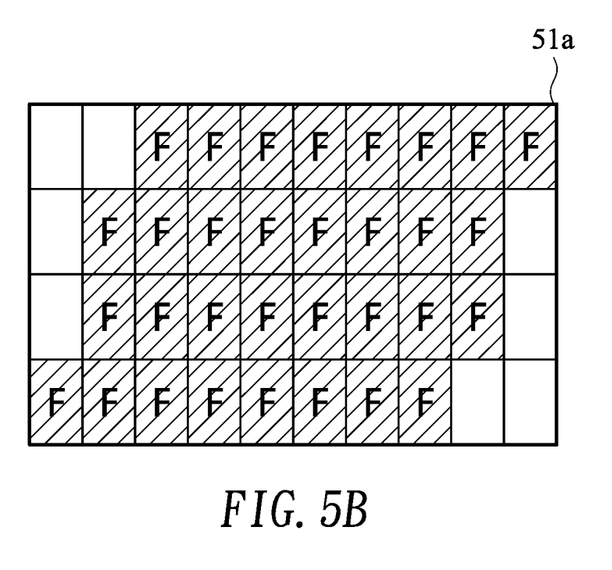
FIG. 5B is an enlarged schematic view of a data group in FIG. 5A.
Figure 5C:
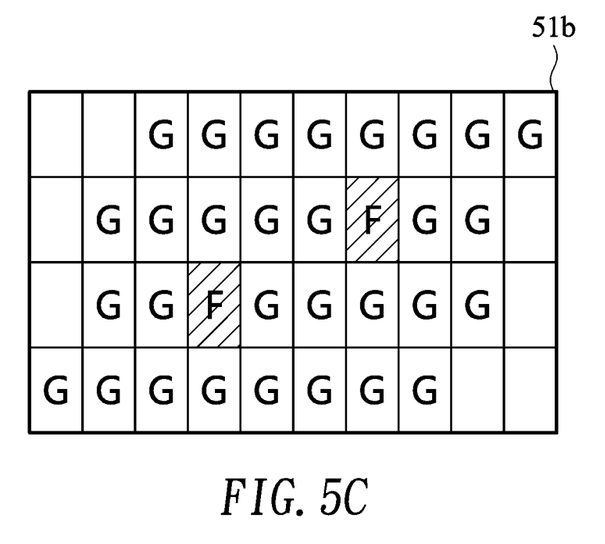
FIG. 5C is an enlarged schematic view of another data group in FIG. 5A.
Figure 6A:
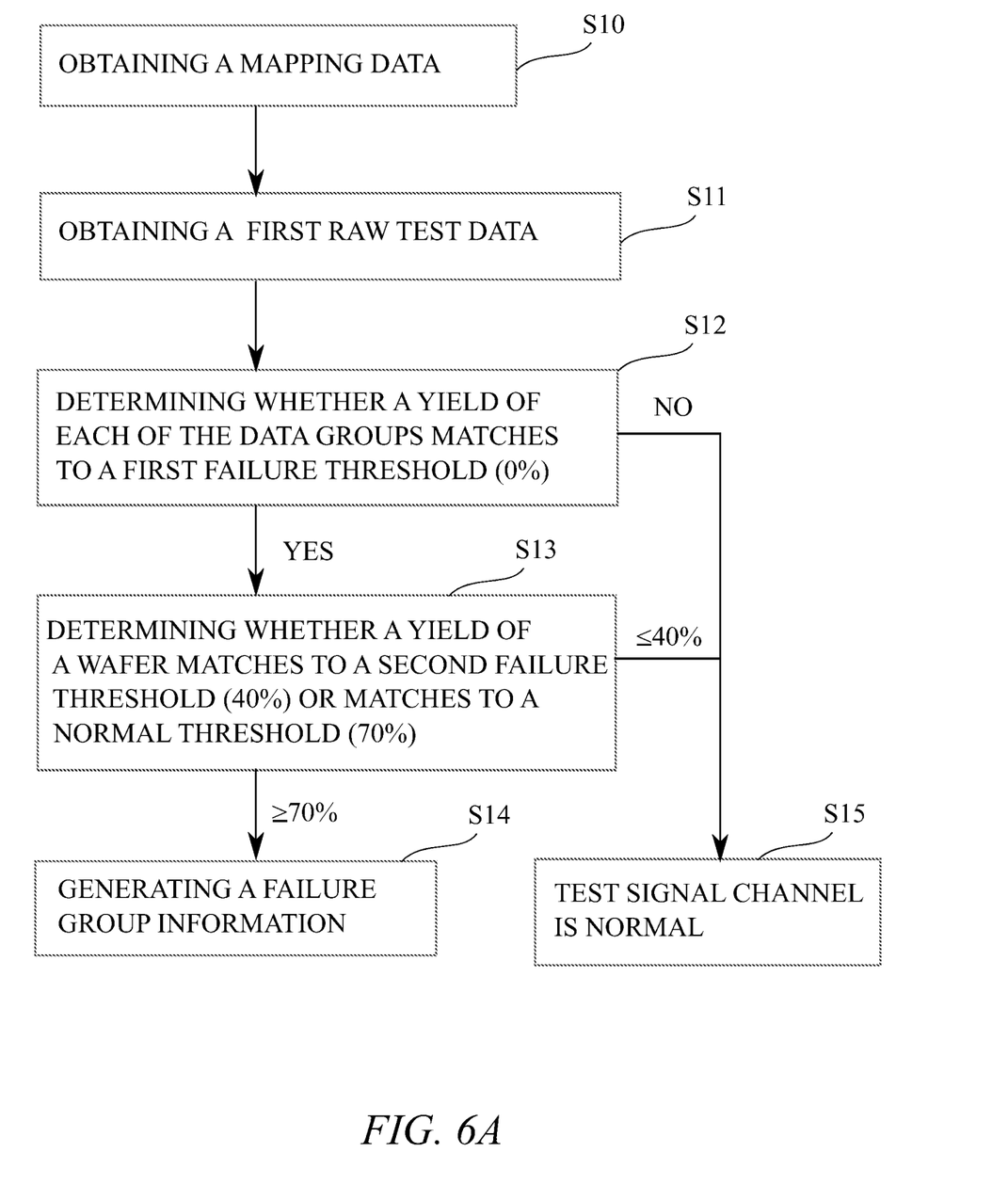
FIG. 6A is a flowchart of a first embodiment of a method in accordance with the present invention.

With reference to FIG. 6A, a first embodiment of the method of detecting abnormal test signal channel of the ATE 1 in accordance with the present invention is shown. With further reference to FIGS. 1, 2 and 5A to 5C, the method of the present invention has steps (a) to (e).

In the step (a), a mapping data is obtained S10. Since the m probes 211 are divided into n groups of probes 23 and each group of probes 23 has k probes 211, the mapping data records that each of the n groups of the probes corresponds to one of the q test signal channels, wherein q>n or q=n;

In the step (b), a first raw test data 50 for an x DUTs 41 of a wafer 40 is obtained (S11). The first raw test data 50 has a test data for each DUT 41. The first raw test data 50 may be divided into y data groups 51. In the preferred embodiment, the raw test data 50 is divided to 47 number of data groups 51, wherein y=x/(j*k)=47 and j>0. Since the 32 number of test data shown in FIG. 5B or FIG. 5C are tested by the k probes 221 of the same group of probes 23, the 32 number of test data are defined in the same data group 51a, 51b, wherein j*k=32. Since the test data of all DUTs are respectively corresponding to all blocks of the test data map, FIG. 5A is also used as the raw test data.

In the step (c), a yield of each of the data groups 51 in FIG. 5A is determined according to the test data in the corresponding data group 51 and then compared with a first failure threshold (S12). A first failure group 51a of FIG. 5B is determined when the yield thereof is equal to the first failure threshold. However, when the yield of the data group 51b of FIG. 5C is larger than the first failure threshold, the test signal channel corresponding to the data group 51b of FIG. 5C is normal S15. In the first embodiment, the first failure threshold is 0%.

In the step (d), a yield of the wafer 40 is determined according to the raw test data when the first failure group is determined in the step (c). After, the yield of the wafer 40 is compared with a second failure threshold to determine whether the yield of the wafer 40 matches the second failure threshold (S13). For example, the second failure threshold is 40%.

In the step (e), when the determining result of the step (d) is negative, a failure group information shall be determined (S14). The failure group information records that the test signal channel 211 corresponding to the first failure group 51a is abnormal. In the first embodiment, the failure group information is determined when the yield of the wafer 40 is greater than the second failure threshold and a normal threshold. The normal threshold is larger than the second failure threshold and the normal threshold may be adjustable. For example, the normal threshold may be 70%. In other words, when the yield of the wafer 40 is less than the second failure threshold, the test signal channel is normal S15.

Figure 6B:
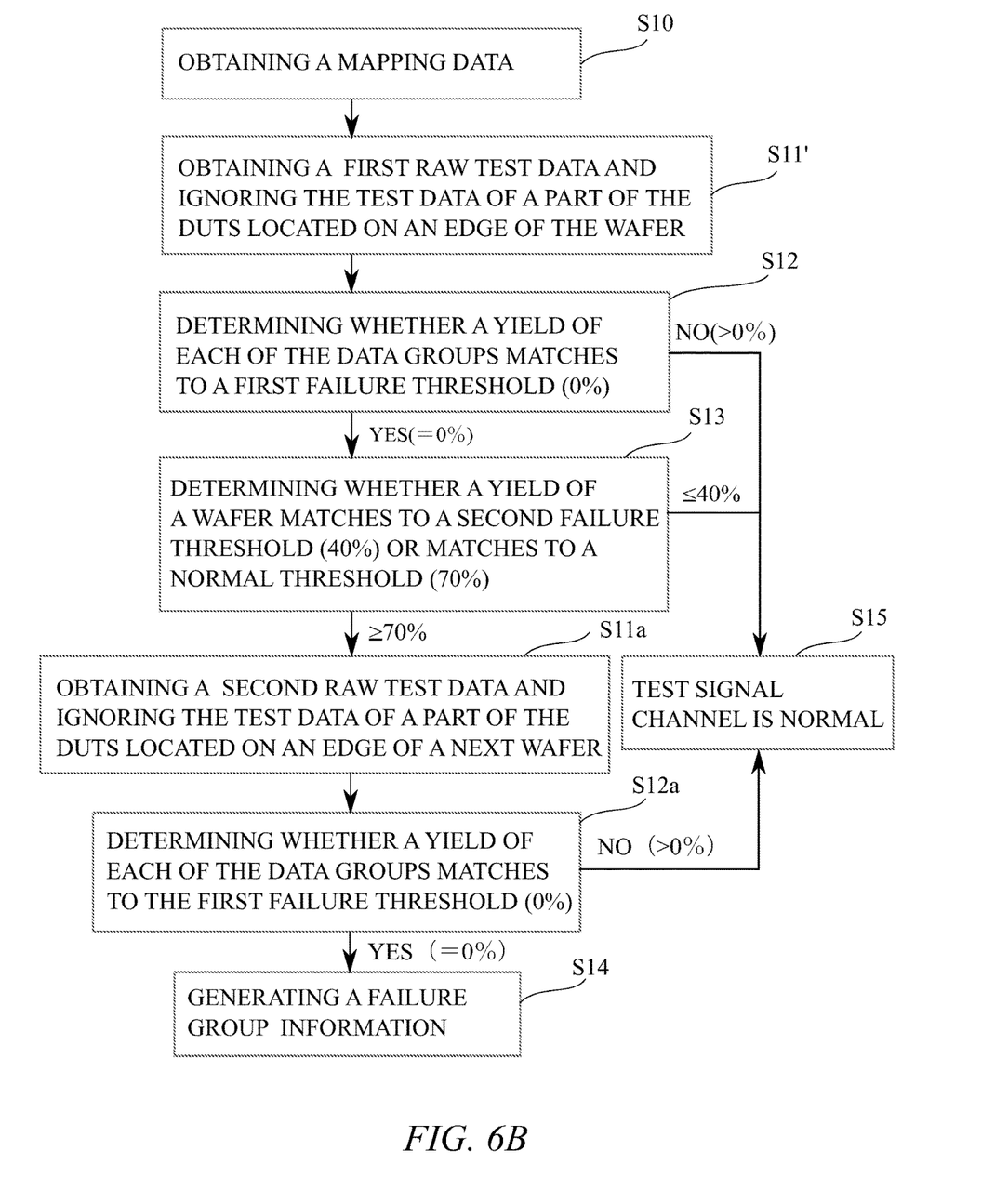
FIG. 6B is a flow chart of a second embodiment of a method in accordance with the present invention.

With reference to FIG. 6B, a second embodiment of the method of detecting abnormal test signal channel of the ATE in accordance with the present invention is shown. As further shown in FIGS. 1, 2 and 5A to 5C, the method of the second embodiment also has the steps (a), (c) and (e) of the first embodiment and further has a new step (b) and a new step (d), In step (b) of the second embodiment, the test data of parts of the DUTs located on an edge 401 of the wafer 40 are further ignored from the first raw test data before dividing the data groups as shown in FIG. 2 (S11'). The ignored edge 401 may include at least one chips Therefore, in the step (d) of the second embodiment, an accuracy of determining the yield of the wafer 40 is increased accordingly.

In the step (d) of the second embodiment, when the determining result of the step (d) of the first embodiment is negative, the step (d) further includes: (d1) obtaining a second raw test data for a plurality of DUTs of a next wafer when the determining result of the step (d) is positive (S11a), wherein the second raw test data having a test data for each DUT of the next wafer and the second raw test data is divided into y data groups; (d2) determining whether a yield of a data group of the step (d1) corresponding to the first failure group in the step (c) matches the first failure threshold (S12a); and (d3) when the yield thereof matches to the first failure threshold, a second failure group is determined and go to the step (e) (S14). In brief, the test signal channel is normal when the test signal channel corresponding to the data group matched the first failure threshold in the step (c), but does not match the first failure threshold in the step (d3) S15. Therefore, an accuracy of determining the abnormal test signal channel.

In addition, in in the step (d1), the test data of parts of the DUTs located on an edge of the next wafer are ignored from the second raw test data before dividing the data groups. A width of the edge of the next wafer is equal to the width of the wafer mentioned in the step (b) of the second embodiment.

Based on the foregoing description, in the method of the present invention the raw test data is firstly divided into the data groups according to the mapping data. The test data in one data group are generated by the same group of probes. The yield of each data group is further estimated. The yield of the wafer is further estimated when the yield of the data group matches the first failure threshold. The abnormal test signal channel is determined when the yield of the wafer does not match the second failure threshold or the yield of the wafer matches the normal threshold. Therefore, in the original test procedure of the ATE adds the method of the present invention, the operator easily identifies which the blocks in the failure color on the test data map are caused by the abnormal test signal channel. In other words, the good DUTs corresponding to blocks in the failure color are not determined to the fail DUTs, too.

Even though numerous characteristics and advantages of the present invention have been set forth in the foregoing description, together with the details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A method of detecting abnormal test signal channel of automatic test equipment (ATE), having q test signal channels and a probe card with m probes, wherein m>q and the method comprises steps of:
   (a) obtaining a mapping data, wherein the m probes are divided into n groups, each group has k probes and the mapping data records that each of the n groups corresponds to one of the q test signal channels, wherein q>n or q=n;
   (b) obtaining a first raw test data for x DUTs of a wafer, wherein the first raw test data having a test data for each DUT and the first raw test data is divided into y data groups, wherein y=x/(j*k) and j is an amount of a test time of the probe card and j>0;
   (c) determining whether a yield of each of the data groups matches to a first failure threshold, wherein a first failure group is determined when the yield thereof matches to the first failure threshold;
   (d) determining whether a yield of the wafer matches a second failure threshold when the first failure group is determined in the step (c), wherein when the yield of the wafer dismatches the second failure threshold, the step (d) further comprises:
      (d1) obtaining a second raw test data for a plurality of DUTs of a next wafer, wherein the second raw test data having a test data for each DUT of the next wafer and the second raw test data is divided into n data groups according to the n groups of the probes;
      (d2) determining whether a yield of a data group of the step (d1) corresponding to the first failure group in the step (c) matches the first failure threshold; and
      (d3) determining a second failure group and going to the step (e) when a determining result of the step (d2) is positive; and
   (e) generating a failure group information when a determining result of the step (d) is negative, wherein the failure group information records the test signal channel corresponding to the first failure group is abnormal.

2. The method as claimed in claim 1, wherein in the step (e), the failure group information is generated when the yield of the wafer is greater than the second failure threshold and greater than or equal to a normal threshold.

3. The method as claimed in claim 1, wherein in the step (b), the test data of a part of the DUTs located on an edge of the wafer are ignored from the first raw test data before dividing the data groups.

4. The method as claimed in claim 2, wherein in the step (b), the test data of a part of the DUTs located on an edge of the wafer are ignored from the first raw test data before dividing the data groups.

5. The method as claimed in claim 1, wherein in the step (d1), the test data of parts of the DUTs located on an edge of the next wafer are ignored from the second raw test data before dividing the data groups.

6. The method as claimed in claim 1, wherein
in the step (b), the edge has at least one DUT; and
in the step (c), the first failure threshold is 0%.

7. The method as claimed in claim 2, wherein
in the step (b), the edge has at least one DUT; and
in the step (c), the first failure threshold is 0%.

8. The method as claimed in claim 3, wherein
in the step (b), the edge has at least one DUT; and
in the step (c), the first failure threshold is 0%.

9. The method as claimed in claim 4, wherein
in the step (b), the edge has at least one DUT; and
in the step (c), the first failure threshold is 0%.

10. The method as claimed in claim 5, wherein
in the step (d1), the edge has at least one DUT; and
in the step (d2), the first failure threshold is 0%.

11. The method as claimed in claim 6, wherein
in the step (d), the
second failure threshold is 40%.

12. The method as claimed in claim 7, wherein
in the (d), the
second failure threshold is 40%.

13. The method as claimed in claim 8, wherein
in the step (d), the
second failure threshold is 40%.

* * * * *